(12) United States Patent
Shalev (10) Patent No.: US 7,991,085 B2
(45) Date of Patent: Aug. 2, 2011

(54) EARLY ENERGY MEASUREMENT

(75) Inventor: Ron Shalev, San Diego, CA (US)

(73) Assignee: Wi-Lan, Inc., Ottawa, Ontario (CA)

( * ) Notice: Subject to any disclaimer, the term of this patent is extended or adjusted under 35 U.S.C. 154(b) by 722 days.

(21) Appl. No.: 11/427,651

(22) Filed: Jun. 29, 2006

(65) Prior Publication Data

US 2008/0002792 A1   Jan. 3, 2008

(51) Int. Cl.
*H04L 27/28* (2006.01)
(52) U.S. Cl. .................................. 375/345; 375/260
(58) Field of Classification Search .............. 375/259, 375/260, 345; 455/234.1
See application file for complete search history.

(56) References Cited

U.S. PATENT DOCUMENTS

| | | | |
|---|---|---|---|
| 7,027,530 B2 * | 4/2006 | McFarland et al. | 375/341 |
| 2005/0207334 A1 * | 9/2005 | Hadad | 370/203 |

OTHER PUBLICATIONS

"OFDM for Mobile Data Communications", available at <<http://www.iec.org/online/tutorials/ofdm/topic04.html>>, accessed Mar. 20, 2006, 5 pages.

Van Nee, et al., "OFDM for Wireless Multimedia Communications", Universal Personal Communications, Artech House Publishers, pp. 33-42 and 80-86.

* cited by examiner

*Primary Examiner* — David B Lugo
(74) *Attorney, Agent, or Firm* — Volpe and Koenig, P.C.

(57) ABSTRACT

In a described implementation of early energy measurement, a wireless device adjusts a receiver gain during each current symbol time responsive to a signal energy level measured in a previous symbol time.

20 Claims, 9 Drawing Sheets

EARLY ENERGY MEASUREMENT

BACKGROUND

Wireless communication is a virtual necessity in today's society. People use cordless phones, cellular phones, wireless data communication devices, etc. on a daily basis. The ability to communicate wirelessly has become pervasive in homes, businesses, retail establishments, and in the outdoors generally. Consequently, people can now communicate while in transit and in almost any environment.

Wireless communication involves the use of a limited resource: the electromagnetic spectrum. Different wireless communication schemes involve using different bands or segments of the electromagnetic spectrum in different manners. Typically, each particular segment of the electromagnetic spectrum is utilized in accordance with a wireless standard that has been created by a government entity and/or an industry consortium.

There are many wireless standards under which wireless devices operate today. Example wireless standards include, but are not limited to, Bluetooth, Digital Enhanced Cordless Telecommunications (DECT), Code Division Multiple Access (CDMA)-2000, Wideband-CDMA (WCDMA), Wi-Fi, WiMAX, and so forth. Wireless standards that have a marketing-oriented name typically also have a corresponding more technical name for the standard. For example, the term "Wi-Fi" is usually considered to correspond to at least the IEEE 802.11(a), (b), and (g) standards. Similarly, the term "WiMAX" is usually considered to correspond to at least a subset of the IEEE 802.16 standard.

Devices that operate in accordance with any of these or many other standards can generally receive and transmit electromagnetic signal waves. The power involved in the transmission and reception of the signals is usually regulated to avoid wasting power at the device and to avoid unnecessary interference between competing electromagnetic signal waves that are simultaneously traveling through the same airspace. Consequently, measuring the energy of a received signal wave is a common aspect of the signal wave reception process.

SUMMARY

In a described implementation of early energy measurement, a wireless device adjusts a receiver gain during each current symbol time responsive to a signal energy level measured in a previous symbol time. However, other method, system, apparatus, device, media, procedure, arrangement, etc. implementations are described herein.

BRIEF DESCRIPTION OF THE DRAWINGS

The same numbers are used throughout the drawings to reference like and/or corresponding aspects, features, and components.

DETAILED DESCRIPTION

Introduction

As described above, measuring the energy of a received signal wave is a common aspect of the signal wave reception process. An energy level of the received signal is measured to determine if the gain of the receiver should be adjusted. The gain can be increased or decreased depending on the measured energy level. The received energy level can vary significantly depending on any of a number of factors.

More specifically, in wireless systems the power level of the signal that is received at the antenna typically varies over a large range of values. For example, in a cellular system it is not uncommon for the signal level at the antenna to vary ten thousand to one as a subscriber station moves closer to and farther away from the base station. Digital signal processing techniques are currently unable to process signals having such a large dynamic range. Hence, one of the functions of the radio frequency component of the subscriber station is to adjust the signal level to a more constant level prior to its presentation to the digital portion of the subscriber station's receiver. The mechanism for creating a more constant power level at the input to the digital portion of the receiver is termed automatic gain control (AGC.)

In many modulation techniques, the amplitude of the signal that is transmitted over the wireless link carries information. A simple example of this concept is an amplitude modulation (AM) radio signal. In such systems, the relative amplitude of the signal carries the audio information that is heard when listening to an AM radio station.

While a receiver is making a gain adjustment through the AGC mechanism, the variations in amplitude at the input to the digital portion of the receiver are no longer largely a function of the received energy. Instead, the variations in amplitude are a function of both the received energy level and the adjusting AGC gain setting. Consequently, the receive signal cannot be properly demodulated while the gain of the receiver chain is changing.

Conventional approaches to receiver gain adjustment entail measuring a signal, adjusting the gain, and receiving desired information contained in a given symbol during each given symbol time. An example conventional approach is described below with reference to a timing diagram.

Figure 1:
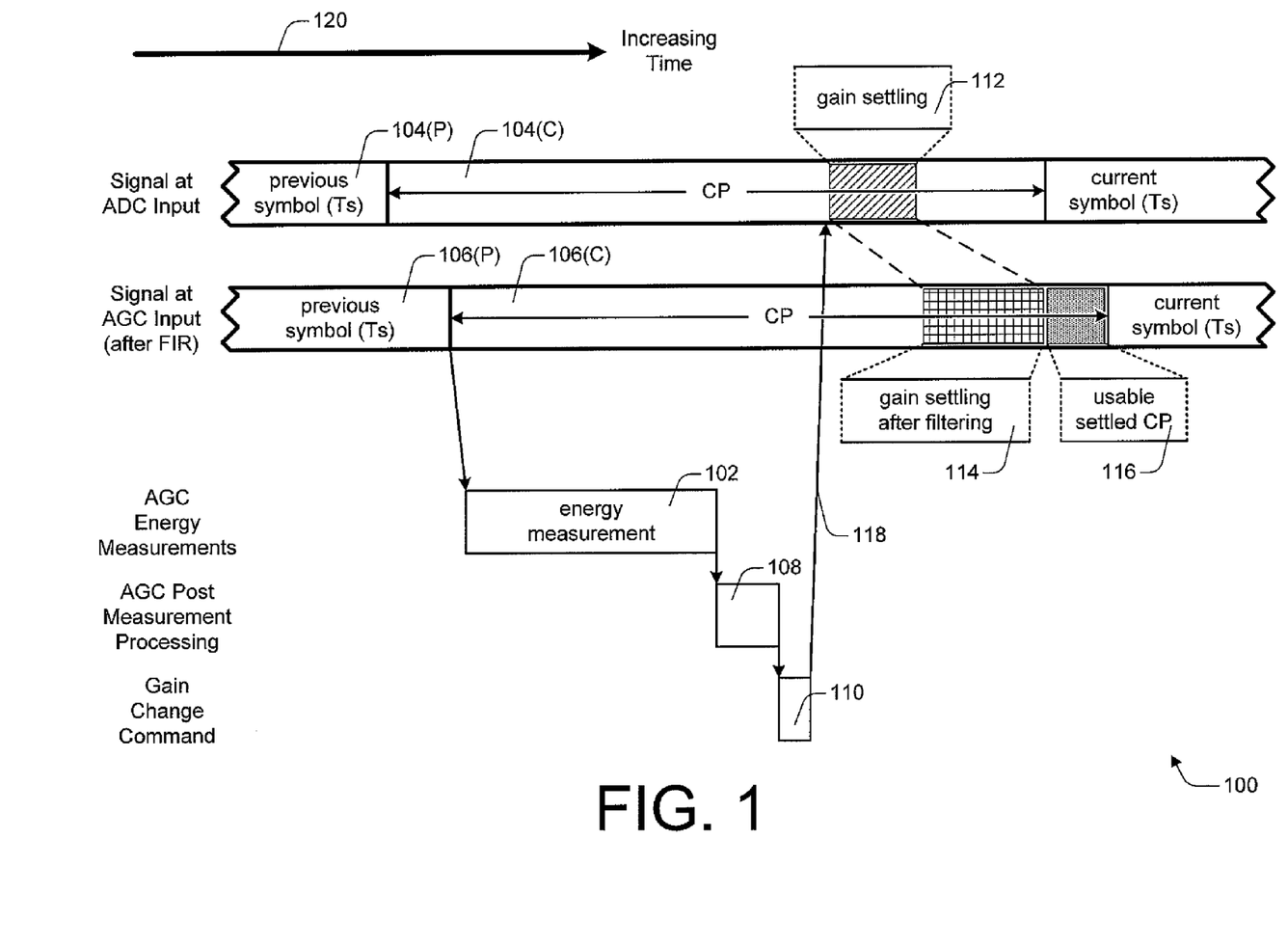
FIG. 1 is a timing diagram illustrating a conventional approach to the scheduling of energy measurements with regard to symbol times.

FIG. 1 is a timing diagram 100 illustrating a conventional approach to the scheduling of energy measurements 102 with regard to symbol times 104 and 106. The conventional approach illustrated in timing diagram 100 is described with respect to a receiver having an analog-to-digital converter (ADC) and an automatic gain control (AGC), neither of which is explicitly shown in FIG. 1. Timing diagram 100 includes the following illustrated portions from top to bottom in FIG. 1: the signal at the ADC input, the signal at the AGC input, AGC energy measurements (e.g., energy measurement 102), AGC post-measurement processing, and a gain change command. Time increases from left-to-right as indicated by time arrow 120.

Received signals are processed at the ADC prior to being processed at the AGC. The received signal is typically filtered by a finite impulse response (FIR) filter (not explicitly shown in FIG. 1) after the ADC but prior to being applied to the AGC input. Because a finite amount of time is consumed when processing the received signal at each component, the received signal becomes offset in time (i.e., delayed) at the AGC input as compared to at the ADC input. The signal at the ADC input is labeled 104(P) and 104(C), and the signal at the AGC input is labeled 106(P) and 106(C). The displayed portion of the received signal is divided into a previous symbol time 104(P) and 106(P) and a current symbol time 104(C) and 106(C).

In between communication (e.g., transmission and/or reception) of two consecutive data symbols, many wireless standards institute a guard time (GT). The GT ensures, or at least increases the likelihood, that two consecutive data symbol communications will not interfere with each other through typical electromagnetic wave communication characteristics, such as multipath fading or delay spread.

With orthogonal frequency division multiple access (OFDMA) and orthogonal frequency division multiplexing (OFDM) schemes, the GT is often referred to as a cyclic prefix (CP). The CP for the current symbol time 104(C) and 106(C) is specifically designated in FIG. 1 with "CP". In accordance with OFDM principles, a copy of the last portion of the transmitted data symbol shape is appended onto the beginning of the transmitted data symbol shape to form the CP. The IEEE 802.16 standard is one example of a standard that supports OFDMA systems. Other examples include, but are not limited to, asymmetric digital subscriber line (ADSL) systems, some Wi-Fi systems (e.g., IEEE 802.11(a) and (g)), contemplated so-called $4^{th}$ Generation (4G) wireless standards (which may include IEEE 802.16), and so forth.

With timing diagram 100, energy measurement 102 for the current symbol time 104(C) and 106(C) is initiated at the beginning (or at least close to the beginning) of the CP for the current symbol time 106(C) at the AGC input. During energy measurement period 102, the energy level of the received signal during the current symbol time 106(C) is being measured by the AGC.

After energy measurement period 102, the AGC has a post-measurement processing period 108 that consumes additional time. There is also a gain change command period 110 in which a gain change command is issued to an RU receiver component (not explicitly shown in FIG. 1) as represented by arrow 118. This gain change command sets a new value of the receiving gain of the radio frequency components. The radio frequency components react with a relatively slow time constant, and a finite amount of time is therefore required for the radio frequency components to settle to the designated new gain setting. After settling, the signal level at the ADC input has been adjusted to the desired level. Gain settling period 112 represents the time during which the radio frequency components are changing the amplitude of the signal at the input to the ADC. As noted above, the signal is unusable during this time period.

The FIR filter institutes some fixed delay between the ADC and the AGC. It therefore also inserts some settling time as show by gain settling after filtering period 114. After accounting for the time offset due to ADC and FIR filter processing, only a relatively short portion of the CP remains. This period is termed the usable settled CP period 116.

The usable settled CP period 116 can be beneficially used for a number of purposes. For example, the usable CP period can be used for channel estimation. Unfortunately, after so much of the CP period has been consumed with energy measurement, gain change, and the resulting gain settling times, the remaining CP duration that is available for other purposes can be insufficient for those purposes.

Conventional theories, thinking, and practices dictate that energy measurements for a given current symbol time are to be conducted during that given current symbol time. It has been accepted doctrine that for the receiver gain control to be effective at setting the receiving gain, the energy measurements on which the gain setting is based are made during the same symbol time that the gain setting is to be employed. In contrast, the inventor has discovered that the usable settled portion of the CP can be extended by conducting energy measurements in a first symbol time for the purpose of setting a receiver gain in a second different symbol time.

Hence, with certain implementations as described herein, energy measurements performed in order to set a receiver gain may be performed during a symbol time that precedes the symbol time in which the receiver gain setting is employed. For example, the energy level of a received signal may be measured during an immediately-previous symbol time. The gain setting derived from this energy measurement may then be employed in a current symbol time to receive the current data symbol of the signal.

The remainder of this "Detailed Description" is divided into three sections. A first section is entitled "Example Environments for Early Energy Measurement" and references FIG. 2. A second section references FIGS. 3-5 and is entitled "Example General Implementations for Early Energy Measurement". A third section references FIGS. 6-9 and is entitled "Example Specific Implementations for Early Energy Measurement".

Example Environments for Early Energy Measurement

Figure 2:
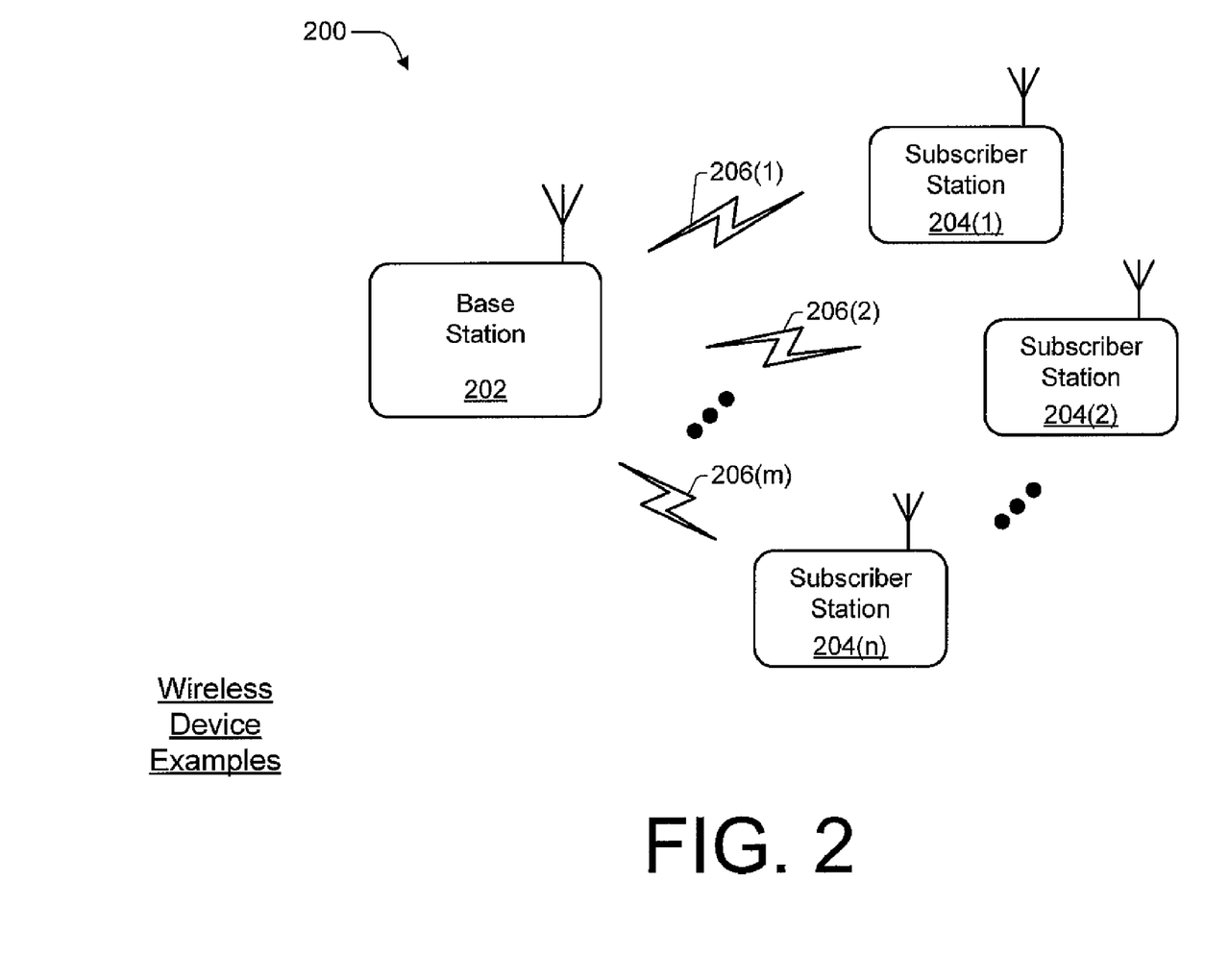
FIG. 2 is block diagram of an example wireless environment having multiple wireless devices.

FIG. 2 is block diagram of an example wireless environment 200 having multiple wireless devices. As illustrated, wireless environment 200 includes a base station 202, "n" subscriber stations 204, and "m" communication links 206, with "n" and "m" being the same or different integers. Although a single communication link 206 is shown as being associated with each subscriber station 204, each subscriber station 204 may be simultaneously participating in multiple communication links 206, including possibly with other subscriber stations 204. Wireless communications environment 200 is representative generally of many different types of wireless communications environments, including but not limited to those pertaining to wireless local area networks (LANs) (e.g., Wi-Fi or WiMAX) or wide area networks (WANs) (e.g., WiMAX) technology, cellular technology (including so-called personal communication services (PCS)), trunking technology, hybrid or multi-use (e.g., WiMAX) technology, and so forth.

In wireless communications environment 200, base station 202 is in wireless communication with subscriber stations 204(1), 204(2) . . . 204(n) via wireless communications or communication links 206(1), 206(2) . . . 206(m), respectively. Although implementations may vary, base station 202 is typically fixed, and subscriber stations 204 are either mobile or stationary. Although wireless communications environment 200 shows base station 202 communicating to "n" subscriber stations 204 in one general direction, base station 202 may actually be communicating with any number of subscriber stations 204 in any number of directions, including omni-directionally.

Base station 202 may be, for example, a nexus point, a trunking radio, a switch or router, an access point, a traditional base station, some combination and/or derivative thereof, and so forth. Subscriber stations 204 may be, for example, a hand-held device; a server, client, personal, desktop, and/or laptop computer; a wireless expansion card, module, adapter, or similar apparatus that is coupled to a computer; a storage device; a set-top box or other television device; a personal digital assistant (PDA); a mobile phone or other mobile appliance; a vehicle having a wireless communication device; a tablet or hand/palm-sized computer; a wireless router; a node of a wireless mesh network; a portable inventory-related scanning device; any device capable of processing generally; some combination thereof; and so forth.

Base station 202 may interact with subscriber stations 204 in accordance with any individual or combined standardized and/or specialized air interface technologies. Example air interface technologies include, by way of example but not limitation, the IEEE 802.11 standard, the IEEE 802.16 standard, cellular phone standards, some combination thereof, or any other such technology. However, where air interface specifics are applicable, the description herein below focuses on the IEEE 802.16 standard and/or OFDMA technology. Nevertheless, energy measurement as described herein is applicable to at least those communication environments generally in which a receiver gain is adjusted each symbol time responsive to the received energy level.

Example General Implementations For Early Energy Measurement

Figure 3:
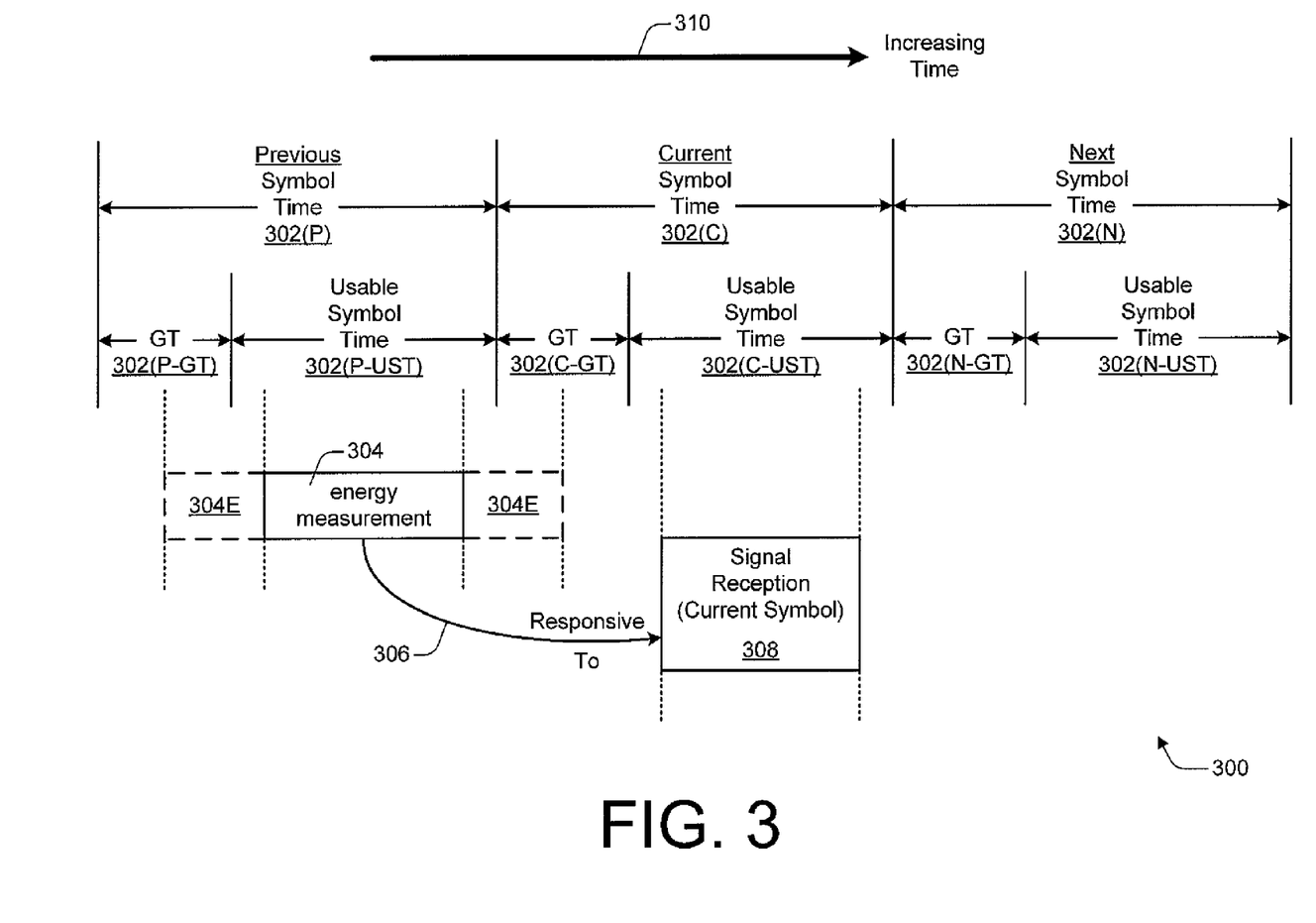
FIG. 3 is a general timing diagram illustrating an example scheduling of energy measurements with regard to previous and current symbol times.

FIG. 3 is a general timing diagram 300 illustrating an example scheduling of energy measurements with regard to previous and current symbol times. Timing diagram 300 is separated into symbol times 302. Three different symbol times 302 are illustrated: a previous symbol time 302(P), a current symbol time 302(C), and a next symbol time 302(N). Time increases from left-to-right as indicated by time arrow 310. Although three different symbol times are shown, additional un-illustrated symbol times may extend in either or both directions.

Each symbol time 302 is divided into a guard time (GT) 302(-GT) and a usable symbol time 302(-UST). The usable symbol time is the portion of the symbol which is used by the Fast Fourier Transform (FFT) which is distinct from the CP. Hence, timing diagram 300 includes: a previous GT 302(P-GT), a previous usable symbol time 302(P-UST), a current GT 302(C-GT), a current usable symbol time 302(C-UST), a next GT 302(N-GT), and a next usable symbol time 302(N-UST). By way of example only, each GT 302(-GT) may correspond to a CP for wireless interfaces that comport with OFDMA schemes.

Signals (e.g., wireless communications 206) that are received at a wireless device have a certain energy level. As described above, superior if not optimum signal reception involves measuring the energy level of the received signal and adjusting the signal reception accordingly at the radio frequency components to accommodate signal processing at the digital signal processing components. Timing diagram 300 includes an energy measurement 304.

Energy measurement period 304 occurs at least partially during previous symbol time 302(P). As illustrated in timing diagram 300, energy measurement 304 is performed during previous usable symbol time 302(P-UST). However, energy measurement 304 is illustrated with two optional extension periods 304E. As shown, energy measurement 304 may start during previous GT 302(P-GT) (or even earlier) and/or continue into current GT 302(C-GT).

Signal reception 308 during current symbol time 302(C) is shown to occupy at least some portion (up to and including all) of current usable symbol time 302(C-UST). Signal reception 308 during current usable symbol time 302(C-UST) is performed at least partly in response to (as represented by arrow 306) energy measurement 304 that is performed at least partly during previous symbol time 302(P), such as during previous usable symbol time 302(P-UST).

Although signal reception 308 for current symbol time 302(C) is shown as being made responsive to energy measurement 304 from previous symbol time 302(P), energy measurement 304 from previous symbol time 302(P) may also be used during next symbol time 302(N). For example, signal reception (not explicitly shown) during next symbol time 302(N) may also be accomplished responsive to energy measurement 304 that was performed during previous symbol time 302(P). In other words, energy measurement that is performed at least partially in any previous symbol time 302(P) may be used to adjust the signal reception in any given subsequent symbol time 302 to thereby preserve a greater portion of the GT 302(-GT) for the given subsequent symbol time 302 for other, non-energy-measuring purposes.

Figure 4:
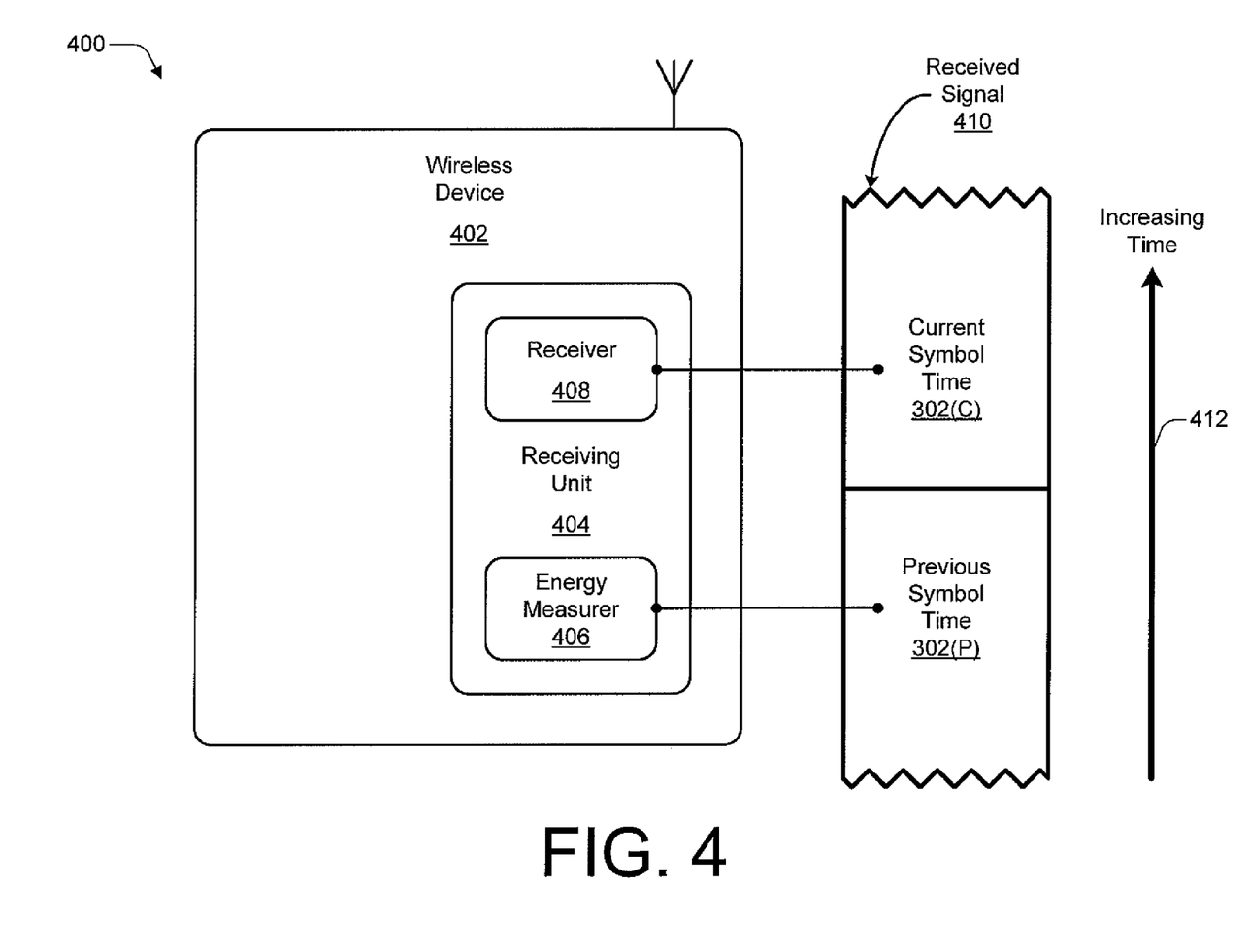
FIG. 4 is a block diagram of an example wireless device having a receiving unit that processes a received signal during previous and current symbol times.

FIG. 4 is a block diagram 400 of an example wireless device 402 having a receiving unit 404 that processes a received signal 410 during previous and current symbol times. In a WiMAX implementation, for example, wireless device 402 may be a base station 202 (of FIG. 2) or a subscriber station 204. More generally, wireless device 402 may be any electronic device, additional examples of which are provided herein above, that is at least capable of receiving a wireless signal.

Received signal 410 includes multiple symbol times 302. The illustrated portion of received signal 410 includes current symbol time 302(C) and previous symbol time 302(P). Received signal 410 is depicted as having time increasing from previous symbol time 302(P) to current symbol time 302(C), as indicated by time arrow 412.

As illustrated, wireless device 402 includes a receiving unit 404. Receiving unit 404 includes an energy measurer 406 and a receiver 408. Wireless device 402 typically includes other components that are not illustrated in FIG. 4. A more detailed diagram of receiving unit 404 is described herein below with particular reference to FIG. 6.

Generally, receiving unit 404 is capable of receiving signal 410 via receiver 408. In a described implementation, receiving unit 404 adjusts a receiver gain during each current symbol time responsive to a received energy level that is measured in a previous symbol time.

More specifically, energy measurer 406 measures an energy level of received signal 410 during at least part of previous symbol time 302(P). Receiver 408 receives at least part of received signal 410 during current symbol time 302(C) responsive to the energy level measured during previous symbol time 302(P). It should be understood that a receiver (e.g., receiver 408) of wireless device 402 receives signal 410 during previous symbol time 302(P) so that energy measurer 406 is subsequently capable of providing a measured energy level to receiver 408 for receiving signal 410 during current symbol time 302(C).

Figure 5:
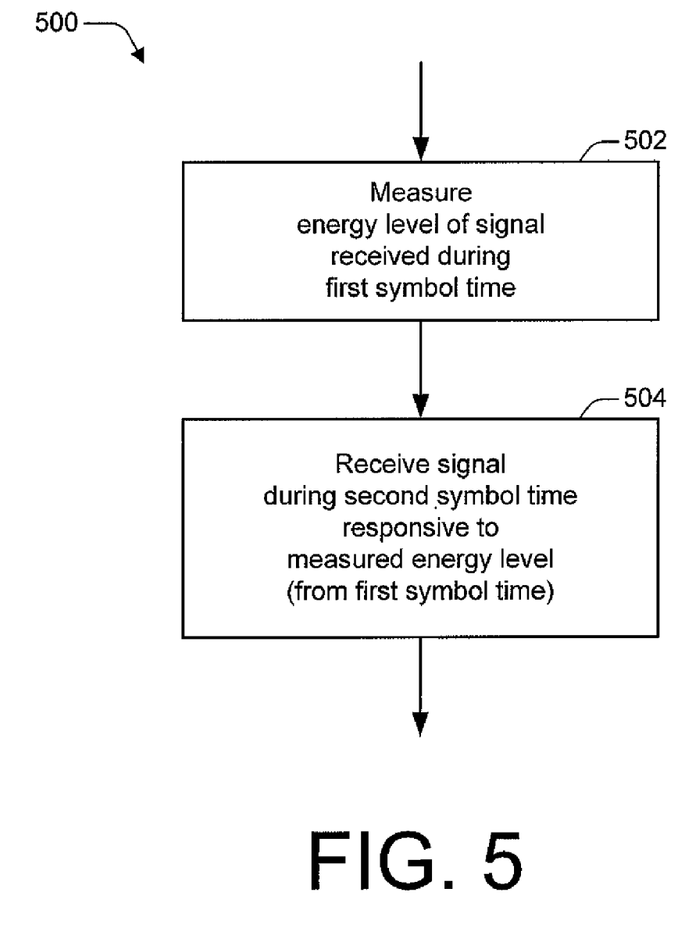
FIG. 5 is a flow diagram that illustrates an example general method for processing a received signal during previous and current symbol times.

FIG. 5 is a flow diagram 500 that illustrates an example general method for processing a received signal during previous and current symbol times. Flow diagram 500 includes two (2) blocks 502 and 504. Although the actions of flow diagram 500 may be performed in other environments and with a variety of hardware, firmware, and/or software combinations, a wireless device 402 (of FIG. 4) may be used to implement the method of flow diagram 500 and is used to describe example implementations of the method.

At block 502, the energy level of a signal received during a first symbol time is measured. For example, an energy level of signal 410 may be measured by energy measurer 406 as signal 410 is received during previous symbol time 302(P).

At block 504, the signal is received during a second symbol time responsive to the energy level as measured during the first symbol time. For example, signal 410 may be received by receiver 408 during current symbol time 302(C) responsive to the energy level of signal 410 as measured during previous symbol time 302(P) by energy measurer 406.

Example Specific Implementations for Early Energy Measurement

Figure 6:
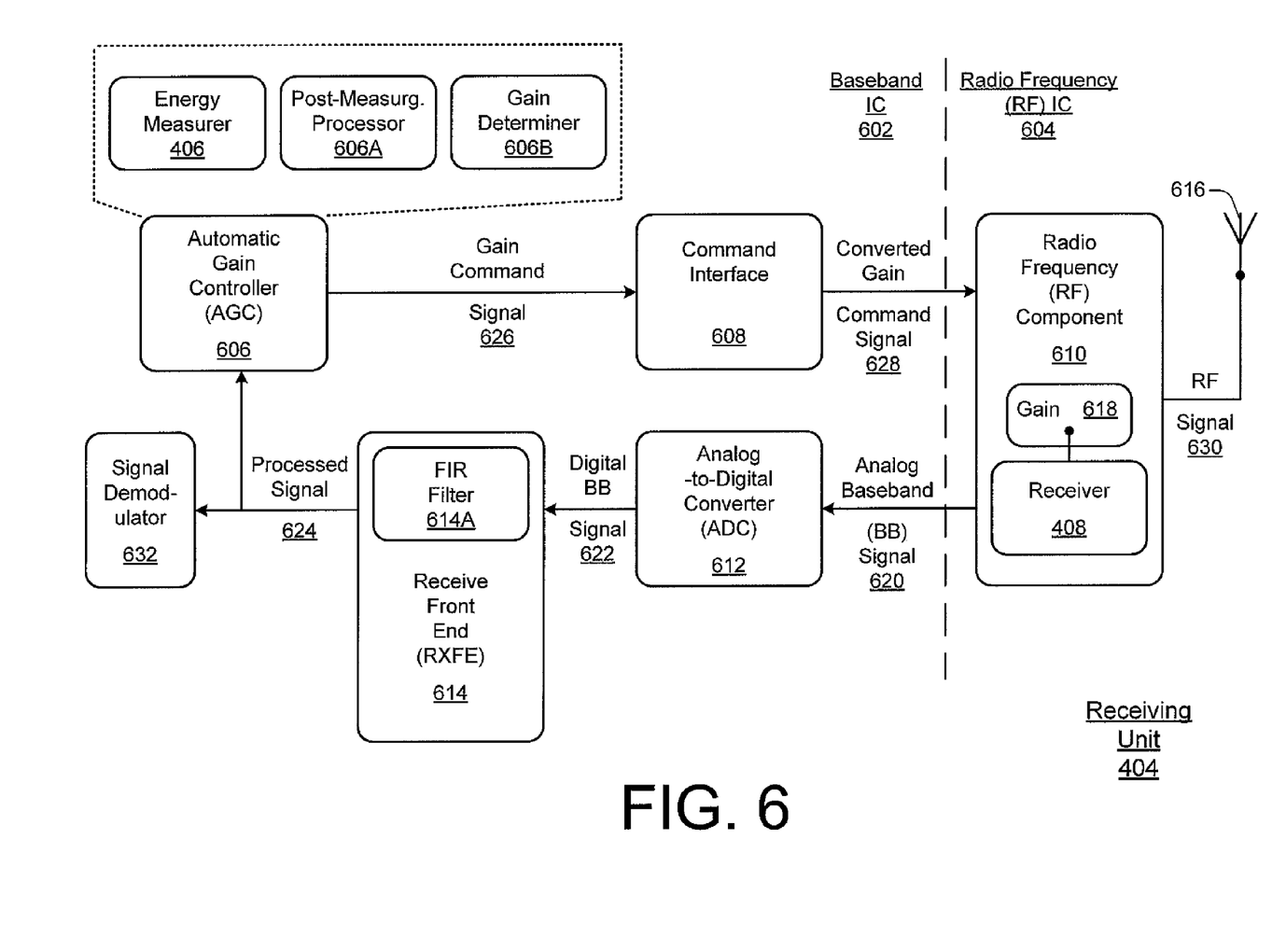
FIG. 6 is a more-detailed block diagram of an example receiving unit as illustrated in FIG. 4.

FIG. 6 is a more-detailed block diagram of an example receiving unit 404 as illustrated in FIG. 4. Example receiving unit 404 includes multiple components. As illustrated, these components are separated into a baseband integrated circuit (IC) 602 and a radio frequency (RF) IC 604. Baseband IC 602 includes an automatic gain controller (AGC) 606, a command interface 608, an analog-to-digital converter (ADC) 612, and a receive front end (RXFE) 614. RF IC 604 includes an RF component 610.

Although the illustrated components of receiving unit 404 are divided into two ICs 602 and 604, they may be implemented differently. For example, each component may be implemented as an independent IC, or even as multiple ICs for a single component. On the other hand, two or more and up to all of the illustrated components may be integrated onto a single chip. Furthermore, the components may be implemented logically as firmware and/or software. An example of the components being implemented as processor-executable instructions in conjunction with a processor (e.g., a digital signal processor (DSP)) is described further herein below with particular reference to FIG. 9. Generally, the components of receiving unit 404 may be realized fully or partially as any combination of hardware, firmware, software, and so forth.

In operation of a described implementation, an RF signal 630 is received at RF component 610 via an antenna 616. RF component 610 includes receiver 408 having an adjustable gain 618. Hence, RF component 610 receives RF signal 630 with receiver 408 responsive to a given setting of gain 618. RF component 610 also converts the received RF (analog) signal 630 to an analog baseband (BB) signal 620, which is typically a lower-frequency signal.

The analog baseband signal 620 is forwarded from RF component 610 to ADC 612. ADC 612 converts analog baseband signal 620 to a digital baseband signal 622. Digital baseband signal 622 is forwarded from ADC 612 to RXFE 614.

The receive front end 614 conducts a number of initial processing operations on digital baseband signal 622. Example initial processing operations may include, by way of example but not limitation, compensation for RF impairments, digital filtering of the signal, down conversion of the sampling rate of the signal, some combination thereof, and so forth. RF impairment compensation may include DC compensation, I/Q mismatch compensation, and so forth.

As illustrated, RXFE 614 includes a finite impulse response (FIR) filter 614A. In a described implementation, optionally in conjunction with other initial processing operations, FIR filter 614A filters digital baseband signal 622 to produce a processed signal 624. Although a FIR filter is specifically shown and described, other filter types (e.g., infinite impulse response (IIR), etc.) may alternatively be employed. Processed signal 624 is forwarded to other components for further processing to identify the received data symbols and to extract the underlying information. For example, processed signal 624 may be forwarded to a signal demodulator 632 that demodulates processed signal 624 to extract the data symbols that were previously modulated onto the carrier signal at a transmitting device.

Receive front end 614 also forwards processed signal 624 to AGC 606. Generally, AGC 606 is responsible for adjusting a gain responsive to the incoming signal level in accordance with a predetermined dynamic range so as to maintain at least adequate performance. As illustrated, AGC 606 includes energy measurer 406, a post-measuring processor 606A, and a gain determiner 606B.

In a described implementation, energy measurer 406 measures the energy level of the received RF signal 630 using the post-filtered, processed version of the received signal 624 as it is output from RXFE 614. The energy level of the received signal may also be measured on un-filtered ADC samples. Alternatively, AGC may be implemented by detecting saturation at the ADC output. Furthermore, AGC may be implemented at the RF chip. For instance, reception may be started at the maximum gain. After each VGA stage, saturation is detected. When saturation is detected, the gain is reduced for the previous VGA.

After the energy level is measured by energy measurer 406, there is some additional post-measuring processing that is conducted by post-measuring processor 606A. Examples of post-measuring processing include, but are not limited to, a translation of linear measurement into logarithmic (dB), a summation with the existing RF gain, a comparison of that sum to the desired signal level, a calculation of the gain error, a determination of whether or not to issue a new gain command based on other AGC states (e.g., if the estimated gain error is smaller than the measurement accuracy, AGC may elect not to update the gain), and so forth. Both the energy measurement and the post-measuring processing consume some finite amount of time.

A desired gain setting for gain 618 of receiver 408 is then determined by gain determiner 606B. For example, if the measured energy level of the received signal is too great, the gain is reduced. If the measured energy level of the received signal is too low, the gain is increased. A gain command 626 is then issued by gain determiner 606B to adjust (e.g., establish, set, change, etc.) gain 618. If the measured energy level is within an error range of the desired gain, then it may be left unchanged.

The gain command (signal) 626 is forwarded from AGC 606 to command interface 608. Command interface 608 converts gain command 626 into a format that is acceptable to the RF component 610. For example, in one implementation, the input to command interface 608 is a heavily-used, general data bus utilized by a set of the digital components within baseband IC 602, and the output of command interface 608 is a dedicated control line used to carry a converted gain command 628 and only a limited number of other commands. The output of command interface 608 may be implemented in accordance with, for example, a serial peripheral interface (SPI) standard. Regardless, but especially when there is no need for an inter-chip interface between AGC 606 and RF component 610, command interface 608 may be omitted in some implementations.

When RF component 610 is provided converted gain command (signal) 628 RF component 610 adjusts gain 618 of receiver 408 responsive to the gain command 628. RF component 610 reacts with a relatively slow time constant; consequently, a finite amount of time is required for RF component 610 to settle to the designated new gain setting of gain 618. Once settled, the signal level of analog BB signal 620 has been adjusted to the desired level.

Figure 7:
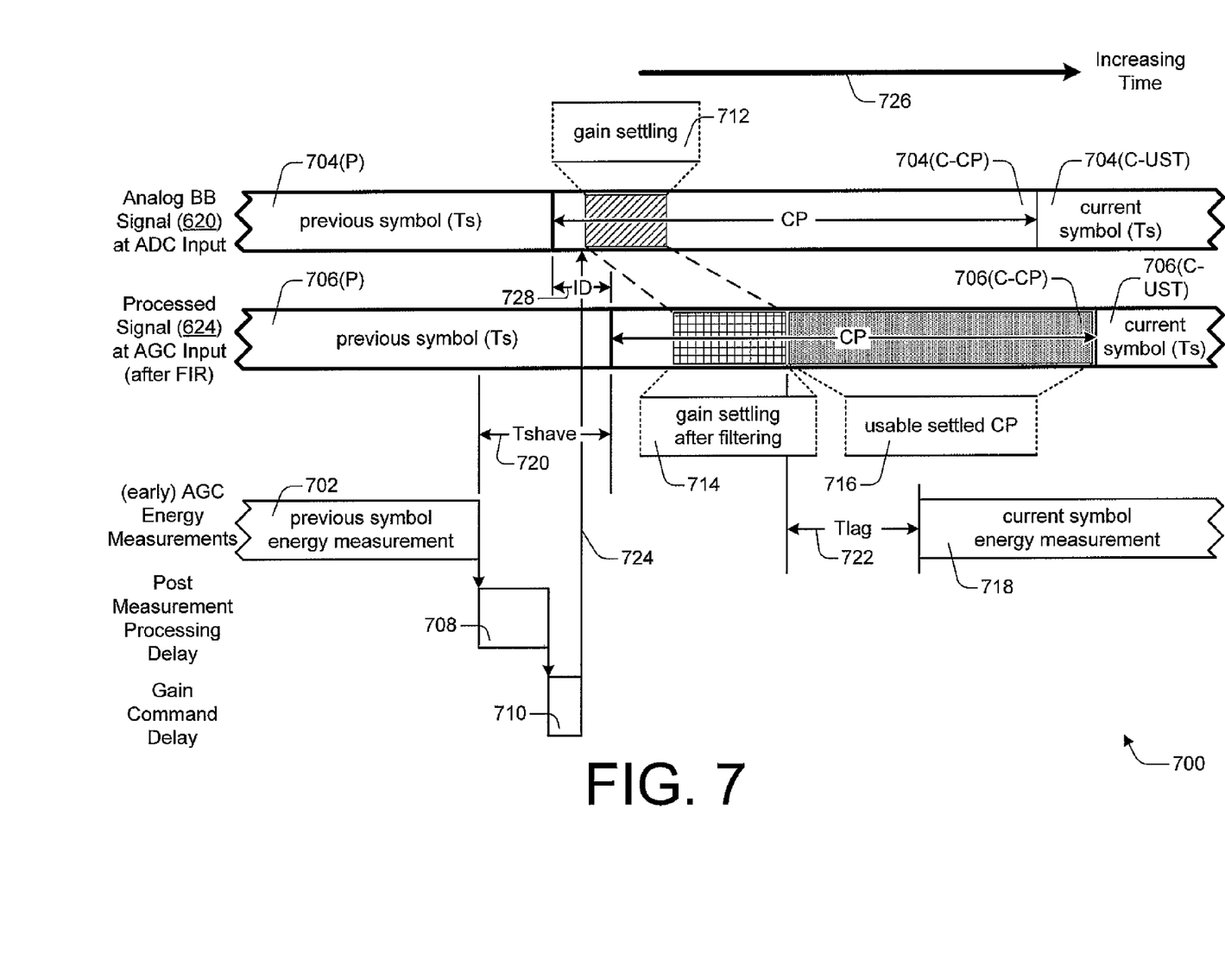
FIG. 7 is a more-specific timing diagram illustrating an example scheduling of energy measurements with regard to previous and current symbol times.

FIG. 7 is a more-specific timing diagram 700 illustrating an example scheduling of energy measurements 702 and 718 with regard to previous and current symbol times. Time increases from left-to-right as indicated by time arrow 726.

The energy-measuring approach illustrated in timing diagram 700 is described with reference to FIGS. 3 and 6. As described in greater detail hereinabove, FIG. 3 illustrates previous symbol time 302(P) and current symbol time 302(C). FIG. 6 illustrates a receiving unit 404 that includes ADC 612, FIR filter 614A, AGC 606 with energy measurer 406, and receiver 408 having an adjustable gain 618.

Timing diagram 700 includes the following representations from top to bottom in FIG. 7: a representation of analog baseband signal 620 at the input of ADC 612, a representation of processed signal 624 at the input of AGC 606, a representation of the time periods 702 and 718 consumed by energy measurer 406 of AGC 606 when performing the (early) energy measuring, a representation of the time delay 708 consumed by post-measuring processor 606A and gain determiner 606B to process previous symbol energy measurement 702, and a representation of the time delay 710 used to execute a gain adjustment command and to provide the converted gain command 628 to RF component 610.

In FIG. 3, current symbol time 302(C) and previous symbol time 302(P) are divided into a previous GT 302(P-GT), a previous usable symbol time 302(P-UST), a current GT 302 (C-GT), and a current usable symbol time 302(C-UST). In early-measuring approach illustrated in timing diagram 700, the guard time (GT) is replaced by the cyclic prefix (CP). As noted above, the GT is referred to as a CP in a number of wireless environments, including OFDMA-based systems.

The representation of analog baseband signal 620 at the input of ADC 612 includes previous symbol time 704(P) and current symbol time 704(C). Current symbol time 704(C) includes a CP 704(C-CP) and a usable symbol time 704(C-UST). Likewise, the representation of processed signal 624 at the input to AGC 606 includes previous symbol time 706(P) and current symbol time 706(C). Current symbol time 706(C) includes a CP 706(C-CP) and a usable symbol time 706(C-UST). The relative offset, which is indicated by implementation delay (ID) 728, of these two signal representations in FIG. 7 illustrates the time delay associated with the functions of ADC 612 and RXFE 614.

In a described implementation, only a portion of the time over which the two different symbol energy measurements 702 and 718 are made are represented in timing diagram 700. Previous symbol energy measurement 702 is performed by energy measurer 406 of AGC 606 during at least a portion of previous symbol time 706(P). When the measurement is terminated, post-measurement processor 606A and gain determiner 606B process the measured energy during time delay period 708. After the adjusted gain value is determined, gain command delay 710 is incurred as the new gain command is transmitted to the command interface 608 and is converted to a form usable by RF component 610. By the end of gain command delay 710, RF component 610 has received and processed converted gain command 628.

As noted above, RF component 610 reacts with a relatively slow time constant; consequently, a finite amount of time transpires while RF component 610 settles to the designated new gain setting. Gain settling period 712 represents the time during which RF component 610 is settling to the designated gain value. Once settled, the signal level of analog baseband signal 620 has been adjusted to the desired level.

As noted above, the relative offset of gain settling period 712 with respect to gain settling after filtering period 714 (which also equals ID 728) illustrates the time delay associated with the functions of ADC 612 and RXFE 614. In addition, the relatively longer duration of gain settling after filtering period 714 in comparison to the duration of gain settling period 712 illustrates the settling time associated with the low pass filtering characteristics of FIR filter 614A.

The gain settling after filtering period 714 ends when processed signal 624 is sufficiently settled so that any remaining settling does not unnecessarily affect the further processing of the signal (e.g., by signal demodulator 632). When gain settling after filtering period 714 ends, a usable settled CP period 716 begins. Usable settled CP period 716 may be used for channel estimation and/or any other purpose or purposes.

As is evident by comparing the duration of usable settled CP period 116 of FIG. 1 to the duration of usable settled CP period 716 of FIG. 7, the duration of usable settled CP period 716 is substantially lengthened. This is accomplished because previous symbol energy measurement 702 is started (and optionally completed) during previous symbol time 706(P). The increased length of usable settled CP period 716 can increase the accuracy of channel estimation. The increased accuracy of the channel estimation can enhance the ability of baseband IC 602 to demodulate the received signal with signal demodulator 632. Thus, by measuring the received signal energy during the previous symbol time as described herein, system performance can be improved.

A symbol energy measurement 718 that is performed during current symbol time 706(C) is also shown. Current symbol energy measurement 718 may start any time after the end of gain settling after filtering period 714. It may begin within CP 706(C-CP) (e.g., during usable settled CP period 716), as illustrated, or at any time later within current symbol time 706(C). The process described above with reference to the previous symbol time is repeated for the current symbol time.

Early energy measuring as described herein may be implemented in any of many possible alternatives. As described above with particular reference to FIG. 3, previous symbol energy measurement 702 may be started at any point during previous symbol time 706(P). It may be completed at any point during previous symbol time 706(P) or during current CP 706(C-CP).

In the illustrated implementation, previous symbol energy measurement 702 is completed during previous symbol time 706(P). Moreover, delay period 708 associated with post-measurement processing and delay period 710 associated with the gain command are incurred during previous symbol time 706(P) of processed signal 624. As represented by arrow 724, this enables the gain change command 628 to be issued to RF component 610 and/or applied to gain 618 of receiver 408 at or very near the beginning of the CP portion of current symbol time 704(C) at the input of ADC 612 (i.e., at or very near the beginning of CP 704(C-CP)). This enables the RF circuitry to settle (as represented by gain settling period 712) and the FIR filter to settle (as represented by gain settling after filtering period 714) to values that are dependent on the new gain setting as close as possible to the beginning of the CP portion of current symbol time 706(C) at the input of AGC 606 (i.e., near the beginning of CP 706(C-CP)).

Two timing values or periods 720 and 722 are also shown in timing diagram 700. Tshave period 720 represents the time between the completion of the symbol energy measurement (e.g., previous symbol energy measurement 702) and the end of the previous symbol time (e.g., previous symbol time 706(P)), which abuts the beginning of the next symbol time (e.g., current symbol time 706(C), at the input to AGC 606. Logical analysis and experiments indicate that overall performance may improve as Tshave becomes shorter, with a zero duration producing a superior result. More specifically, in stationary scenarios or in mobile scenarios when Tlag is relatively long (e.g., Tlag is more than 75% of symbol time), performance is superior when Tshave=processing delay 708+gain command delay 710+ID 728. For mobile scenarios when Tlag is relatively short (e.g., Tlag is less than 75% of symbol time), the performance is not particularly sensitive to Tshave.

Tlag period 722 represents the time between when the symbol energy measurement (e.g., current symbol energy measurement 718) can be started (e.g., at the beginning of usable settled CP period 716) and when the symbol energy measurement is actually started. Logical analysis of the Tlag period is less straightforward because real-world effects work at cross purposes. For example, the following two conflicting effects impact the analysis: (i) longer energy measurements tend to produce more accurate results and (ii) measurements that are temporally closer to when they are to be applied tend to produce more accurate results, especially in a quickly changing wireless environment. In other words, longer measurement periods are desirable in more static conditions (e.g. when the energy level is stable over time), and measurements that are performed closer to a subsequent symbol time are desirable in more dynamic conditions (e.g. when the energy level is changing rapidly with respect to the duration of a symbol.)

Consequently, superior values for Tlag can vary depending on the degree to which the wireless communication channel is fluctuating. If the channel fluctuation is relatively low or even approaches zero, then Tlag can produce superior results when set to approximately zero seconds. On the other hand, if the channel fluctuation is relatively high (e.g., a relative motion between transmitting and receiving wireless devices is 75 miles per hour), then Tlag can produce superior results when set to approximately 50% of symbol time (i.e., approximately half of symbol duration length). However, these are example Tlag values only, and individual implementations may benefit from entirely different values.

Figure 8:
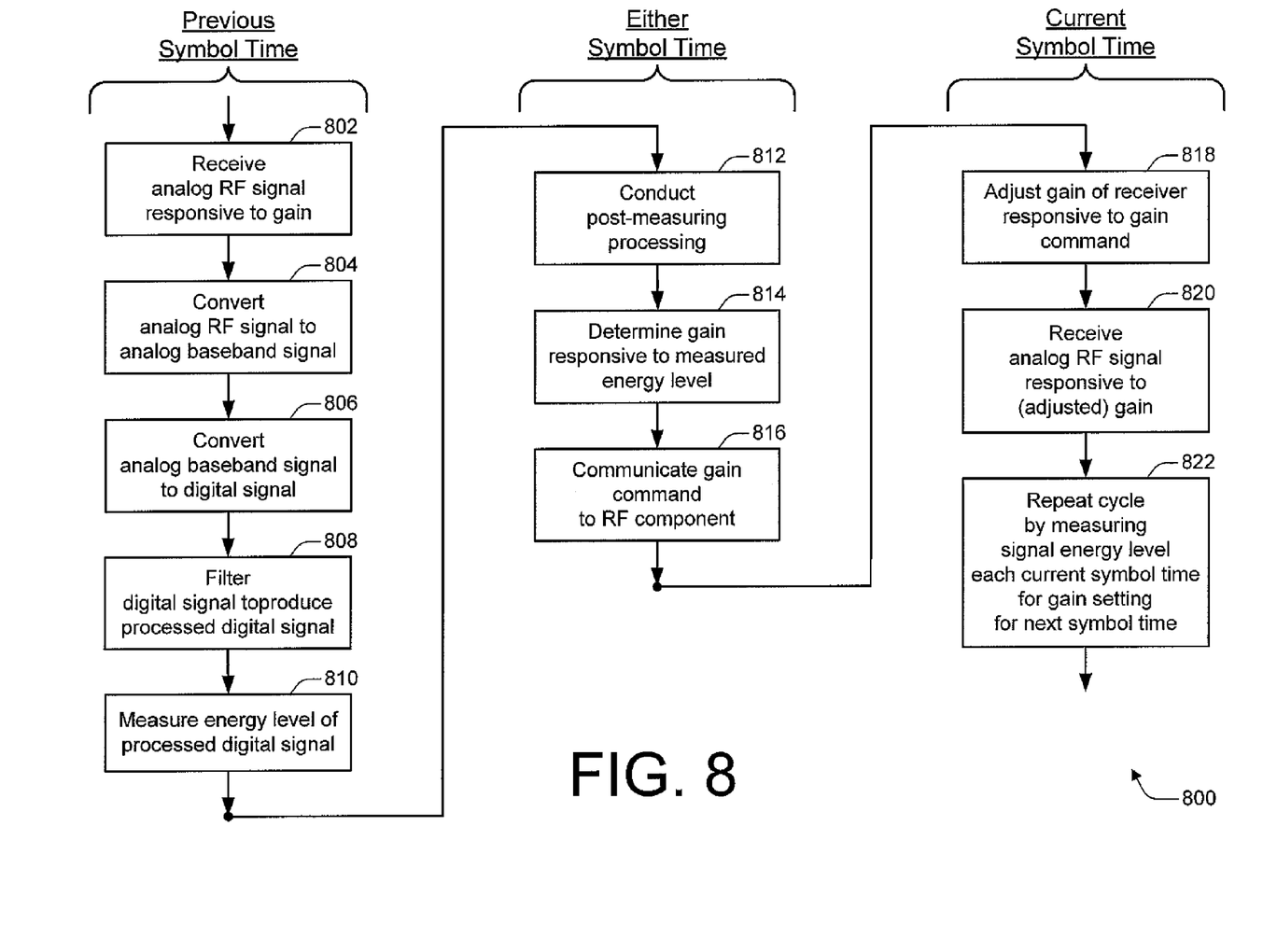
FIG. 8 is a flow diagram that illustrates an example specific method for processing a received signal during previous and current symbol times.

FIG. 8 is a flow diagram 800 that illustrates an example specific method for processing a received signal during previous and current symbol times. Flow diagram 800 includes eleven (11) blocks 802-822. Although the actions of flow diagram 800 may be performed in other environments and with a variety of hardware, firmware, and/or software combinations, a receiving unit 404 (of FIG. 6) may be used to implement the method of flow diagram 800 and is used to describe example implementations of the method.

In a described implementation, the blocks of flow diagram 800 are divided into three different relative symbol time zones: a previous symbol time, a current symbol time, and either the previous or the current symbol time. The actions of blocks 802-810 are performed during the previous symbol time. The actions of blocks 818-822 are performed during the current symbol time. The actions of blocks 812-816 are performed during either symbol time. In addition to the previous symbol time, the action(s) of block 810 may also be performed partially during the current symbol time. Similarly, the actions of any one of blocks 812-816 may be partially performed during either or both of the previous and the current symbol times. The timing of the actions with regard to the example implementation that is illustrated in FIG. 7 is described below.

At block 802, an analog RF signal is received responsive to a gain during a previous symbol time. For example, an RF signal 630 may be received by a receiver 408 that has a gain setting 618 and that is part of an RF component 610. At block 804, the analog RF signal is converted to an analog baseband signal. For example, RF component 610 may convert the received analog RF signal 630 to a lower, baseband frequency signal such as analog baseband signal 620.

At block 806, the analog baseband signal is converted to a digital signal. For example, ADC 612 may convert analog baseband signal 620 to a digital baseband signal 622. At block 808, the digital signal is filtered to produce a processed digital signal. For example, digital baseband signal 622 that is output from ADC 612 may be filtered by FIR filter 614A of a RXFE 614 to produce a processed signal 624.

At block 810, the energy level of the processed digital signal is measured during the previous symbol time. For example, energy measurer 406 of AGC 606 may measure the energy level of processed signal 624 as it is received during the previous symbol time after it has been digitized and filtered. The measuring of the signal energy level (at block 810) may extend into the current symbol time.

At block 812, post-measuring processing is conducted. For example, post-measuring processor 606A of AGC 606 may operate after the energy level has been measured. At block 814, a gain is determined responsive to the measured energy level. For example, gain determiner 606B may determine a new gain setting responsive to the measured energy level from energy measurer 406.

At block 816, the gain command is communicated to an RF component. For example, a gain command 626/628 that is determined by gain determiner 606B may be issued to RF component 610. The communication may entail gain command conversion from gain command 626 to converted gain command 628 by a command interface 608, especially if an inter-chip interface exists between the baseband processing and the RF processing.

As described above, the actions of blocks 812-816 may be performed fully or partially in either the previous symbol time or the current symbol time. In the example illustrated in FIG. 7, the actions of blocks 812 and 814 are performed during previous symbol time 706(P) (e.g., at time delay periods 708 and 710), and the action(s) of block 816 are performed at the beginning of current symbol time 704(C) (i.e., at arrow 724 at the beginning of 704(C-CP)).

At block 818, a gain of the receiver is adjusted responsive to the gain command. For example, gain setting 618 of receiver 408 may be adjusted responsive to gain command 626/628 during current symbol time 704(C) (e.g., during CP 704(C-CP)). Waiting until the start of CP 704(C-CP) avoids the risk of corrupting reception of the data symbol in previous symbol time 706(P). At block 820, the analog RF signal is received responsive to the (adjusted) gain during the current symbol time. For example, RF component 610 continues to receive RF signal 630 via antenna 616, but RF signal 630 is now received with the adjusted gain setting 618 of receiver 408.

At block 822, the cycle is repeated by measuring the received signal energy level during the current symbol time to set a reception gain for the next symbol time. In certain described implementations, especially those with a slowly-changing wireless environment, there may be one or more intervening symbol times between when an energy level measurement is taken and when the gain is adjusted responsive to the measured energy level.

Figure 9:
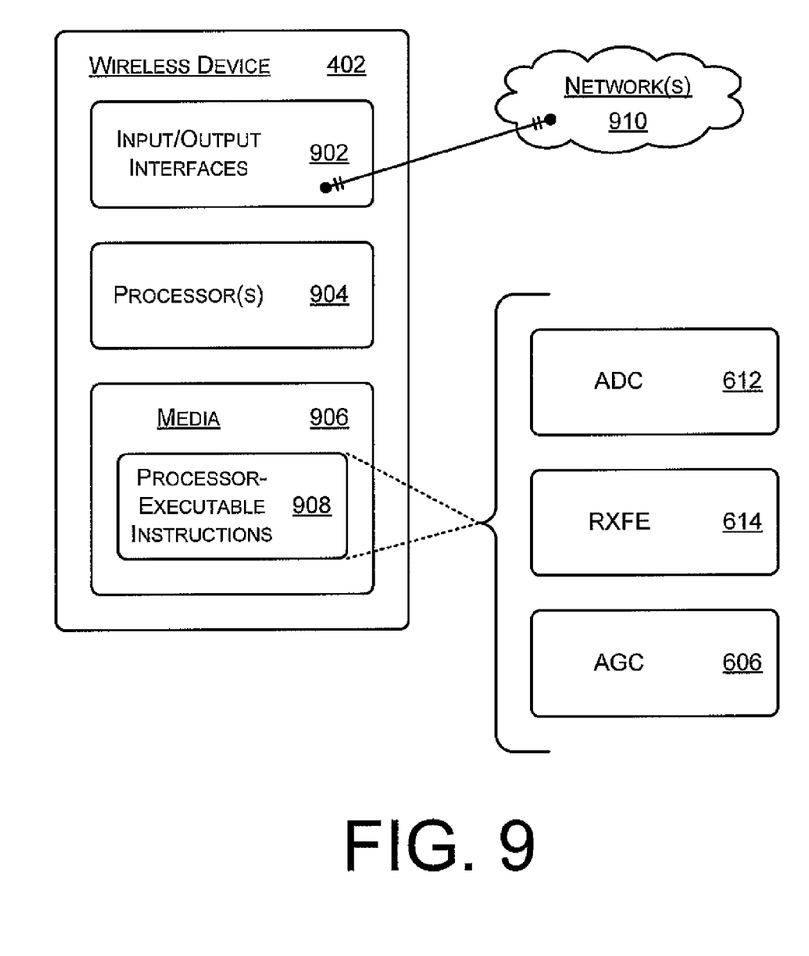
FIG. 9 is another block diagram of an example wireless device that may process a received signal during previous and current symbol times using processor-executable instructions and a processor.

FIG. 9 is another block diagram of an example wireless device 402 that may process a received signal during previous and current symbol times using processor-executable instructions 908 and a processor 904. As illustrated, wireless device 402 includes one or more input/output (I/O) interfaces 902, at least one processor 904, and one or more media 906. I/O interfaces 902 enable wireless device 402 to communicate with one or more networks 910. Networks 910 may be wireless or wired networks, or a combination thereof, that are operating in accordance with any given standard.

I/O interfaces 902 may include, by way of example but not limitation, an antenna 616, an RF component 610, any component of baseband IC 602 (each of FIG. 6), some combination thereof, and so forth. I/O interfaces 902 may also include interfaces for communicating over wired networks. Such interfaces may include a network interface card, a modem, one or more network ports, some combination thereof, and so forth. Wired network interfaces enable wireless device 402 to forward information from a wired network to a wireless network, or vice versa.

Processor(s) 904 may be implemented using any applicable processing-capable technology. Media 906 may be any available media that is included as part of and/or accessible by wireless device 402. It includes volatile and non-volatile media, removable and non-removable media, and storage and transmission media (e.g., wireless or wired communication channels).

Processor(s) 904 may be one or more processors such as central processing units (CPUs), dedicated processing circuits, digital signal processors (DSPs), some combination thereof, and so forth. Generally, processor 904 is capable of executing, performing, and/or otherwise effectuating processor-executable instructions, such as processor-executable instructions 908. Media 906 is comprised of one or more processor-accessible media. In other words, media 906 may include processor-executable instructions 908 that are executable by processor 904 to effectuate the performance of functions by wireless device 402.

Thus, realizations for early energy measurement may be described in the general context of processor-executable instructions. Processor-executable instructions may include programs, applications, coding, modules, objects, interfaces, components, data structures, etc. that perform and/or enable the performance of particular tasks and/or implement particular data structures. Processor-executable instructions may be located in separate storage media, executed by different processors, and/or propagated over or extant on various transmission media.

As specifically illustrated, media 906 comprises at least processor-executable instructions 908. Generally, processor-executable instructions 908, when executed by processor 904, enable wireless device 402 to perform the various functions described herein. Processor-executable instructions 908 may include, for example, an ADC module 612, an RXFE module 614, an AGC module 606, and so forth.

The devices, actions, aspects, features, functions, procedures, modules, schemes, approaches, architectures, components, etc. of FIGS. 1-9 are illustrated in diagrams that are divided into multiple blocks. However, the order, interconnections, interrelationships, layout, etc. in which FIGS. 1-9 are described and/or shown are not intended to be construed as a limitation, and any number of the blocks can be modified, combined, rearranged, augmented, omitted, etc. in any manner to implement one or more methods, apparatuses, systems, devices, procedures, media, arrangements, etc. for early energy measurement. For example, a different portion of the symbol could be used for demodulation. An end portion of a previous symbol could be used as the CP for a current symbol and a corresponding portion of the current CP would then be demodulated by the FFT, Thus, the guard band used by the receiver crosses the boundary between two symbols as created by the transmitter. This is a well-known property of OFDM and OFDMA systems and one to which the current invention can be readily applied.

Moreover, although systems, apparatuses, devices, media, methods, procedures, techniques, schemes, approaches, arrangements, and other implementations have been described in language specific to structural, logical, algorithmic, and functional features and/or diagrams, it is to be understood that the invention defined in the appended claims is not necessarily limited to the specific features or acts described above. Rather, the specific features and acts described above are disclosed as example forms of implementing the claims.

What is claimed is:

1. A method comprising:
   receiving a signal including a first data symbol received during a first usable data symbol time period, a second data symbol received during a second usable data symbol time period, and a third data symbol received during a third usable data symbol time period;
   measuring an energy level of the signal during at least the first usable data symbol time period;
   adjusting a gain of the receiver during a cyclic prefix of the second usable data symbol time period responsive to the energy level measured during at least the first usable data symbol time period;
   measuring an energy level of the signal during at least the second usable data symbol time period; and
   adjusting a gain of the receiver during a cyclic prefix of the third usable data symbol time period responsive to the energy level measured during at least the second usable data symbol time period.

2. The method as recited in claim 1, wherein the second usable data symbol time period comprises a current symbol time period, and the first usable data symbol time period comprises an immediately-previous usable data symbol time period.

3. The method as recited in claim 1, further comprising:
   receiving the signal during the second usable data symbol time period using the adjusted receiver gain.

4. The method as recited in claim 2, wherein the measuring is terminated prior to the end of the first usable data symbol time period such that the adjusting begins prior to a beginning of the second usable data symbol time period.

5. The method as recited in claim 4, wherein the adjusting comprises post measurement processing which is completed prior to the end of the first usable data symbol time period.

6. The method as recited in claim 4, wherein the adjusting comprises issuing a gain command prior to the end of the first usable data symbol time period.

7. The method as recited in claim 1, further comprising:
   issuing a gain adjustment command at an end of the first usable data symbol time period,
   wherein the adjusting is performed in response to the issuing of the gain adjustment command.

8. A wireless device comprising:
   a receiver configured to receive a signal including a previous data symbol received during a previous symbol time period and a current data symbol received during a current symbol time period;

an energy measurer configured to measure an energy level of the signal during at least part of the previous symbol time period including during at least part of a previous usable data symbol time period of the previous symbol time period; and a gain determiner configured to determine a gain command responsive to the energy level measured during at least the at least part of the previous symbol time period and to provide the gain command to the receiver such that the receiver responds to the gain command during a cyclic prefix (CP) of the current symbol time period, wherein the receiver is configured to receive the signal during the current usable data symbol time period responsive to the gain command;

wherein the energy measurer is configured to measure an energy level of the signal during at least the current usable data symbol time period, and wherein the receiver is configured to receive the signal during a next usable data symbol time period at an adjusted gain responsive to the energy level measured during said at least the current usable data symbol time period.

9. The wireless device as recited in claim 8, wherein the wireless device is configured to perform channel estimation after a gain-settling-after-filtering period and during a usable settled portion of the CP of the current symbol time period.

10. The wireless device as recited in claim 8, wherein the wireless device operates in accordance with an orthogonal frequency division multiplexing (OFDM) or orthogonal frequency division multiple access (OFDMA) scheme.

11. The wireless device as recited in claim 8, wherein the energy level measuring is completed prior to a start of the CP of the current symbol time period.

12. The wireless device as recited in claim 8, wherein the gain command is provided to the receiver at the start of the CP of the current symbol time period.

13. The wireless device as recited in claim 8, further comprising:

a command interface that is configured to convert the gain command to a converted gain command, wherein the energy measurer and the gain determiner are part of a baseband integrated circuit (IC), and the receiver is part of a radio frequency (RF) IC, and wherein the gain determiner is configured to provide the gain command to the receiver as the converted gain command via the command interface.

14. A wireless device comprising:

a receiving unit that is configured to:

receive a signal including a previous data symbol received during a previous symbol time period, a current data symbol received during a current symbol time period, and a next data symbol received during a next symbol time period, adjust a receiver gain during the current symbol time period, responsive to a received energy level measured in at least the previous data symbol time period during a cyclic prefix (CP) portion of the current symbol time period and receive information during a usable data symbol time period portion of the current symbol time period, and adjust the receiver gain during the next symbol time period, responsive to a received energy level measured in at least the current data symbol time period during a CP portion of the next symbol time period and receive information during a usable data symbol time period portion of the next symbol time period.

15. A wireless device comprising:

a radio frequency component including a receiver having a gain, the receiver configured to receive a signal responsive to the gain, the received signal including a previous data symbol received during a previous symbol time period, a current data symbol received during a current symbol time period, and a next data symbol received during a next symbol time period;

a filter configured to filter the signal received by the receiver to provide a filtered signal; and an automatic gain controller configured to receive the filtered signal from the filter and including an energy measurer configured to measure an energy level of the filtered signal during the previous symbol time period including during a previous usable data symbol time period, wherein the gain of the receiver is adjusted responsive to the energy level measured during the previous symbol time period and prior to the current symbol time period, wherein the gain of the receiver is adjusted responsive to the energy level measured during the current symbol time period and prior to the next symbol time period.

16. The wireless device as recited in claim 15, wherein the measurer is further configured to measure the energy level of the filtered signal during the previous symbol time period starting during a cyclic prefix (CP) of the previous symbol time period but after a beginning of a usable settled portion of a cyclic prefix (CP) of the previous symbol time period.

17. The wireless device as recited in claim 15, wherein the measurer is configured to measure the energy level of the filtered signal during the previous symbol time period and terminate prior to an end of the previous symbol time period to accommodate a post-measurement processing time period and a gain determination time period.

18. The wireless device as recited in claim 15, wherein the automatic gain controller further includes a gain determiner configured to issue a gain command to the radio frequency component, the gain command applied being to the gain of the receiver after a start of a cyclic prefix (CP) of the current symbol time period.

19. The wireless device as recited in claim 18, further comprising:

a radio frequency integrated circuit that includes the radio frequency component; and a baseband integrated circuit that includes the filter and the automatic gain controller, the baseband integrated circuit further including a command interface that converts the gain command for communication from the baseband integrated circuit to the radio frequency integrated circuit.

20. A non-transitory computer-readable storage medium containing a first set of instructions adapted to create a processor, the processor being configured to implement a second set of instructions, the second set of instructions comprising:

a receiving code segment for receiving a signal including a first data symbol received during a first usable data symbol time period, a second data symbol received during a second usable data symbol time period, and a third data symbol received during a third usable data symbol time period;

a measuring code segment for measuring an energy level of the signal during at least the first usable data symbol time period;

an adjusting code segment for adjusting a gain of the receiver during a cyclic prefix of the second usable data symbol time period responsive to the energy level measured during said at least the first usable data symbol time period;
a measuring code segment for measuring an energy level of the signal during at least the second usable data symbol time period; and
a receiving code segment for receiving the signal including a third usable data symbol time period at an adjusted gain responsive to the energy level measured during said at least the second usable data symbol time period.

* * * * *